United States Patent
Miske et al.

[19]

[11] Patent Number: 6,163,199
[45] Date of Patent: Dec. 19, 2000

[54] OVERVOLTAGE/UNDERVOLTAGE TOLERANT TRANSFER GATE

[75] Inventors: Myron Miske, Newfields, N.H.; Jeffrey B. Davis, El Dorado Hills, Calif.

[73] Assignee: Fairchild Semiconductor Corp., South Portland, Me.

[21] Appl. No.: 09/240,544

[22] Filed: Jan. 29, 1999

[51] Int. Cl.$^7$ .......................... H03K 17/687; H03K 17/16
[52] U.S. Cl. .......................... 327/434; 327/427; 327/389; 326/113
[58] Field of Search .................... 327/389, 404, 327/427, 434; 326/113, 121

[56] References Cited

U.S. PATENT DOCUMENTS

| | | | |
|---|---|---|---|
| 4,473,761 | 9/1984 | Peterson | 327/382 |
| 4,985,647 | 1/1991 | Kawada . | |
| 5,023,688 | 6/1991 | Ando et al. . | |
| 5,054,001 | 10/1991 | Guillot | 326/38 |
| 5,065,057 | 11/1991 | Kawasaki . | |
| 5,465,054 | 11/1995 | Erhart | 326/34 |
| 5,506,528 | 4/1996 | Cao et al. | 327/404 |
| 5,617,055 | 4/1997 | Confalonieri et al. | 327/404 |
| 5,635,745 | 6/1997 | Hoeld | 327/408 |
| 5,639,680 | 6/1997 | Hoeld | 327/404 |
| 5,789,781 | 8/1998 | McKitterick | 257/347 |
| 5,880,620 | 3/1999 | Gitlin et al. | 327/534 |
| 5,963,080 | 10/1999 | Miske et al. | 327/534 |

FOREIGN PATENT DOCUMENTS

| | | |
|---|---|---|
| 0 698 966 A1 | 2/1996 | European Pat. Off. . |
| 0 729 232 A1 | 8/1996 | European Pat. Off. . |
| 5-37325 | 2/1993 | Japan . |

*Primary Examiner*—Timothy P. Callahan
*Assistant Examiner*—Terry L. Englund
*Attorney, Agent, or Firm*—Pierce Atwood; Chris A. Caseiro

[57] ABSTRACT

A transfer gate or pass gate circuit for transferring logic signals between nodes for a range of available high-potential supply levels. The primary transfer gate is designed to protect against potentials that either exceed either a high-potential or a low-potential level or that undershoot such potential levels. For overshoot (overvoltage) tolerance, this is achieved by coupling a NMOS transistor in parallel with a pair of PMOS transistors that are coupled in series. All three transistors are located between two nodes, either of which can be the input or the output of the transfer gate. The NMOS transistor is designed to be larger than the PMOS transistors and carries most of the transfer capability. The smaller PMOS transistors are designed to eliminate potential drops that would otherwise occur with a single NMOS transistor or with a complementary pair of transistors. For undershoot (undervoltage) tolerance, a PMOS transistor is coupled in parallel with a pair of NMOS transistors that are coupled in series.

15 Claims, 4 Drawing Sheets

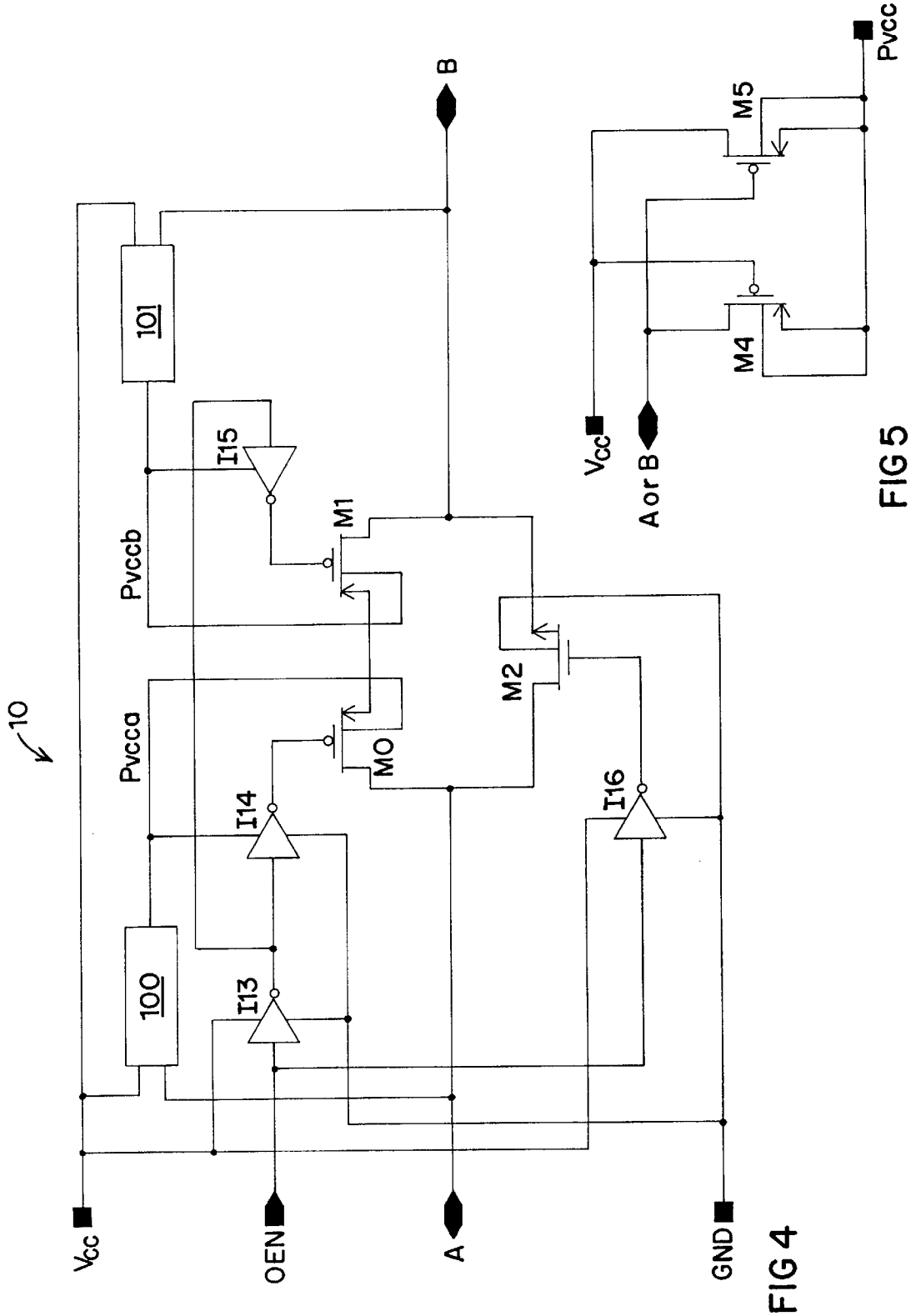

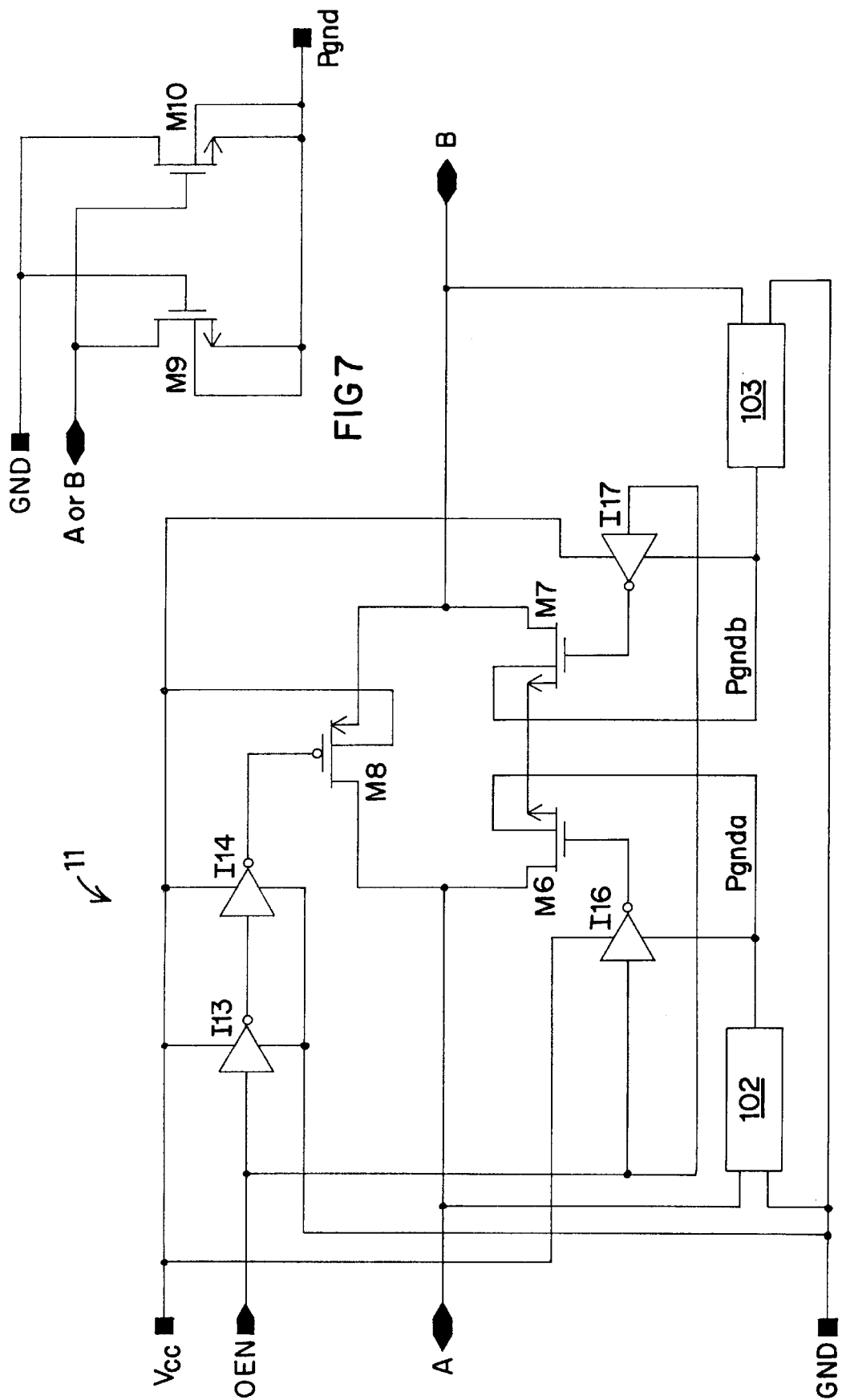

OVERVOLTAGE/UNDERVOLTAGE TOLERANT TRANSFER GATE

BACKGROUND OF THE INVENTION

1. Field of the Invention

The present invention relates to electronic switches. In particular, the present invention relates to semiconductor switches, including those formed of one or more metal-oxide-semiconductor (MOS) transistors. More particularly, the present invention relates to analog and digital semiconductor switches, including but not limited to, those defined as pass-gate transistors or transfer gates.

2. Description of the Prior Art

Developments in semiconductor technology have created the capability to produce low-cost, highly reliable switches that are, effectively, implementations of mechanical relays. They have been found to be of particular use, when implemented, as single pole, single throw, type relays, but are not limited thereto. Semiconductor switches are being used more and more as replacements for the prior mechanical relays, due to the high switching speed available as well as their ability to transfer relatively high currents without failure. These switches are often referred to as transfer gates or pass transistors as they employ the characteristics of transistors—usually MOS transistors—to either permit or prevent the passage of a signal.

It is well known that switches are widely used in many fields. They are used in all variety of large- and small-scale consumer products, including, but not limited to, automobiles and home electronics. They can be and are used as analog routers, gates, and relays. They are used as digital multiplexers, routers, and gates as well.

As part of continuing developments in the field of semiconductor devices, particularly regarding size and operating speed, there has been a reduction in the amount of power required to operate such devices. Whereas standard operating systems utilize a 5-volt supply for proper operation of MOS and bipolar transistors, reductions of scale have yielded the capability to operate at lower supply levels, including 3-volt and 2-volt systems.

There are limitations, however, in the use of such devices. These limitations are related to fabrication vagaries, and, more significantly, they are related to inherent characteristics. In particular, it is to be noted that there are threshold potential levels that must be overcome in order to activate semiconductor devices. These threshold activation levels are of importance, but not of insurmountable limitation, when the available supply is at least five volts, as is the case in most present systems. The threshold activation for externally-supplied transistors is typically about 0.8 volt. In a system having a high-potential power rail of 5 volts used to supply a logic high or "1" value, and a low-potential power rail of ground, or 0 volt used to supply a logic low or "0" value, for example, a drop in potential on the order of the threshold activation level noted will not cause a loss in system operation or function. That is because a logic high and a logic low signal will be adequately transferred via an NMOS transistor as long as that signal falls within a range of values near the noted rail values.

A number of prior-art transfer gates have been developed for digital and analog applications. However, these devices fail to address problems associated with the transition to operations at the "lower" high-potential levels noted, and they are particularly ineffective when input values go beyond high- and low-potential power rail values. That is, when a transfer gate input potential exceeds the high-potential rail Vcc positively, or it exceeds the low-potential rail GND negatively. One such device that has been in relatively common use is shown in FIG. 1.

A complementary pair of transistors, NMOS transistor M1 and PMOS transistor M2 conduct signals between nodes A and B, where each of those nodes is couplable to an extended circuit. When a control signal OEN (shown in FIG. 1 associated with node A as the input for purposes of illustration only, but which can also be associated with node B as the input) is a logic "high" or "1," transistor M1 is turned on, and as a result of the inversion produced by inverter I1, transistor M2 is also on. In this condition, the two transistors are "on" and the potential at node B is essentially the same as the potential at node A. When OEN is at a logic "low" or "0," both transistors are off and there exists a high impedance for the transfer of any signal between nodes A and B. This is true for all potentials at node A or B that are less than the potential of high-potential power rail Vcc and greater than low-potential power rail GND. However, when either the input or the output node is greater than Vcc or less than GND, the potential associated with the typical logic low at the gate of transistor M1 and a typical logic high at the gate of M2 is insufficient to keep those transistors off. For a potential greater than Vcc, M2 will turn on, for a potential less than GND, M1 will turn on, irrespective of the logic level applied at input OEN. As a result, an overvoltage condition at either the input or the output will cause M1 and M2 to permit a signal to pass through that the OEN deems should be blocked. An undervoltage condition will likewise be passed under the same OEN condition.

For the purpose of this disclosure, the terms "overvoltage" and "undervoltage" mean the potential variations noted that occur under static (DC) conditions as well as dynamic (AC) conditions. For that reason, overvoltage may be used interchangeably with overshoot. Similarly, undervoltage may be used interchangeably with undershoot. Passage of any of those conditions when OEN deems such conditions should be blocked is undesirable.

A device designed to resolve at least one portion of the problems associated with the complementary transfer gate of FIG. 1 is shown in FIG. 2. The device involves removal of PMOS transistor M2, leaving NMOS transistor M1 coupled between nodes A and B, where node A is the input from, or output to, a first extended circuit, and node B is the input from, or output to, a second extended circuit. As before, control node OEN is designed to control enablement of M1. In operation, a logic level high from OEN to the gate of M1 renders M1 on and thereby permits a signal to pass between nodes A and B. A logic level low turns M1 off and blocks the transfer of the signal between A and B. Elimination of transistor M2 resolves the problem when the potential at node A or node B exceeds Vcc because that transistor is not there to be turned on. That does not eliminate the possibility that the transfer gate will turn on when it should be off under conditions of negative voltage exceeding GND.

An alternative and more complex prior transfer gate is shown in FIG. 3. That device includes a series of pass transistors, two of which, M3 and M5, are NMOS transistors, with the intermediate transistor M4 a PMOS transistor. When OEN transmits a logic low or "off" signal, the circuit of FIG. 3 will remain off, even when Vcc and GND are exceeded. However, the effective drain-source resistance $R_{DS}$ of this device is several hundred ohms, on the order of 500 ohms for an otherwise suitable transfer gate, and is a function of the coupling of the three transistors in series. While that resistance is acceptable in analog devices, it is not so in digital systems where the RC time constant is a critical consideration in the rate of operation of a circuit. Therefore, this transfer gate would not be particularly suitable for digital circuitry that operates at faster and faster rates.

A problem associated with the lower operational potentials previously mentioned remains with the circuit of FIG. 2, its equivalent single-PMOS-transistor transfer gate circuit, and the circuit of FIG. 3. As indicated, degradation in signal level will always occur with the use of semiconductor devices. When Vcc is at 5.0V that is not a problem in that standard transistor-transistor logic (TTL) high-potential levels can be met in spite of such degradation. This degradation, identified as $VCC-V_{OH}$, is dependent upon the potential drop or drops that occur as a signal passes through circuit components. For the transistors of the transfer gates of FIGS. 1–3, $V_{OH}$ is related to the threshold turn-on potential $V_{TN}$ and the source-bulk potential $V_{SB}$, of the transistor or transistors in use by the approximation equation $VOH=Vcc-V_{TN}-\gamma(V_{SB})^{1/2}$ where $\gamma$ is defined as the "body effect factor" of the transistor, and is well known to those skilled in the art. In general, $V_{OH}$ degradation is approximately 1.4V. When logic high signals associated with 5.0V high-potential rails are on the order of 4.5V–5.5V such degradation is inconsequential in that even a signal at 4.5V–1.4V=3.1V will still be a logic high signal. However, when a 3.3V rail is the voltage source, a degradation of 1.4V may cause a logic high to be interpreted as a logic low. As a result, the prior transfer gates of FIGS. 1–3 cannot be used in relatively low-voltage supplied systems.

Therefore, what is needed is a semiconductor-switching device that is a transfer gate or pass gate suitable for digital and analog operations. What is also needed is such a device that will be operational during all overvoltage/undervoltage conditions, including input/output potentials rising above Vcc and falling below GND. Finally, what is needed is such a transfer gate that can operate in systems using high-potential sources of less than 5.0V.

SUMMARY OF THE INVENTION

It is an object of the present invention to provide a semiconductor circuit that acts as a switch for digital and analog operations. It is also an object of the present invention to provide a semiconductor switch that is a transfer gate or pass gate operable for a broad range of supply voltages, particularly supply voltages of less than five volts. It is a further object of the present invention to provide a transfer gate circuit that remains operable for input or output potential levels that exceed either the high-potential power rail value or the low-potential power rail value.

These and other objectives are achieved in the present invention in several ways, all designed to circumvent the threshold potential drop associated with non-complementary MOSFET semiconductor devices, so that it can be used in a variety of low-voltage systems. In particular, the primary means for achieving the noted goals is by the arrangement of a set of MOS transistors coupled together, to the high- and low-potential power rails, and to the input and output nodes of the circuit such that isolation is achieved under all voltage conditions. Other embodiments of the present invention achieve such isolation under most expected conditions. Basically, an overvoltage tolerant circuit of the present invention includes the combination of three MOS transistors to take the place of the single NMOS transistor of the prior art shown in FIG. 2. An arbiter block subcircuit may be used to ensure that the higher of the two potentials associated with the high-potential power rail and the input to be transferred, whether from node A to node B or node B to node A, is used as the supply to a pseudo high-potential power rail that is in turn coupled to the transistors of the present invention.

An undervoltage tolerant circuit also includes a combination of three MOS transistors, while obtaining both overvoltage tolerance and undervoltage tolerance is achieved with four MOS transistors. As earlier noted, for the purpose of this disclosure, the present invention provides tolerance for overvoltage and undervoltage (static) conditions as well as overshoot and undershoot (dynamic) conditions. For that reason, the terms overvoltage and overshoot may be used interchangeably and undervoltage and undershoot may be used interchangeably.

In the following discussions of operation, the overvoltage tolerant transfer gate is explained. The undervoltage circuit behaves in a complementary fashion. The two circuits can exist together in a modified form to obtain an overvoltage and undervoltage tolerant transfer gate. For the most part, NMOS transistors of the present invention provide the primary low-impedance path for the output load charging and discharging. However, as previously noted with regard to the prior devices, an NMOSFET-based transfer gate conducts a signal from one node to another with a potential drop of approximately 1.4V. That is not a problem for a 5-volt system; however, it is not useable in systems supplied at lower potentials. The present invention resolves this through the coupling in parallel of two series PMOS transistors of a preferred embodiment of the present invention eliminates the problem of high-potential-drop in that they ensure full-rail power availability to the node that the signal is passed to, regardless of signal direction, in a manner to be described with regard to the detailed description of the invention. A key difference between the present invention and the device of FIG. 3 is in the arrangement of the three primary transfer transistors.

The prior device includes two NMOS transistors and one PMOS transistor, all of which are in series and thereby increase the effective resistance of the gate. The present device, on the other hand, preferably places two PMOS transistors in series with each other, while an NMOS transistor is placed in parallel with the two PMOS transistors. In addition to resolving the concern of $V_{OH}$ degradation, this arrangement also reduces by approximately ½-order of magnitude the effective resistance $R_{DS}$ of the transfer gate, making it suitable for digital as well as analog applications.

With regard to undervoltage tolerance, the present invention places two NMOS transistors in series with each other, while a PMOS transistor is placed in parallel with the two NMOS transistors. The undershoot circuitry of the present invention additionally includes an arbiter block sub-circuit complementary to that associated with the overshoot tolerant circuitry in order to supply to the three-transistor configuration the lower potential between that of the standard low-potential power rail of the system and the node, A or B, from which the signal is to be transferred. This complementary configuration addresses $V_{OL}$ degradation as well as effective resistance problems of the type previously noted.

These and other advantages will become apparent upon review of the following detailed description of the embodiments of the invention, the accompanying drawings, and the appended claims.

BRIEF DESCRIPTION OF THE DRAWINGS

FIG. 4 is a schematic block diagram of the overvoltage tolerant transfer gate circuit of the present invention, showing an NMOS transistor in combination with a pair of PMOS transistors as the primary transfer components of the transfer gate device in an extended circuit.

FIG. 5 is a schematic diagram of the P-Arbiter blocks providing extended high-potential power for the transfer gate device shown in FIG. 4.

FIG. 6 is a schematic block diagram of the undervoltage tolerant transfer gate circuit of the present invention, showing a PMOS transistor in combination with a pair of NMOS transistors as the primary transfer components of the transfer gate device in an extended circuit.

FIG. 7 is a schematic diagram of the N-Arbiter blocks providing extended low-potential power for the transfer gate device shown in FIG. 6.

DETAILED DESCRIPTION OF THE PREFERRED EMBODIMENTS OF THE INVENTION

Figure 1:
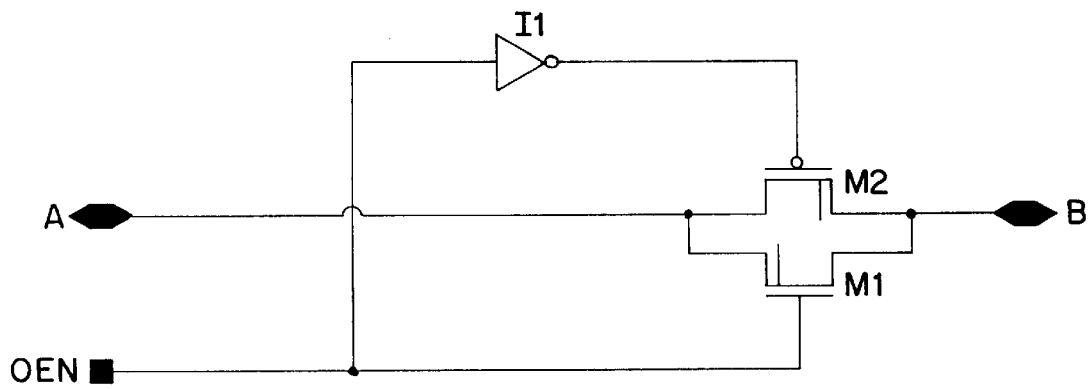
FIG. 1 is a simplified schematic diagram of a prior-art transfer gate having a CMOS transistor pair as the primary transfer element of the transfer device.
Figure 2:
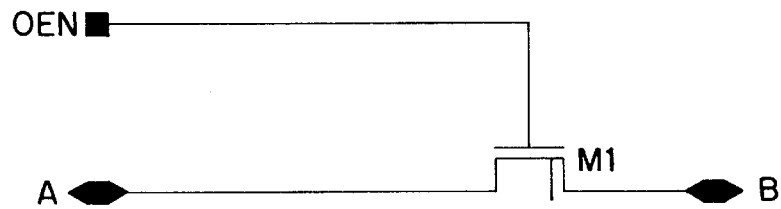
FIG. 2 is a simplified schematic diagram of a prior-art transfer gate having a single enhancement-mode NMOS transistor as the transfer device.
Figure 3:
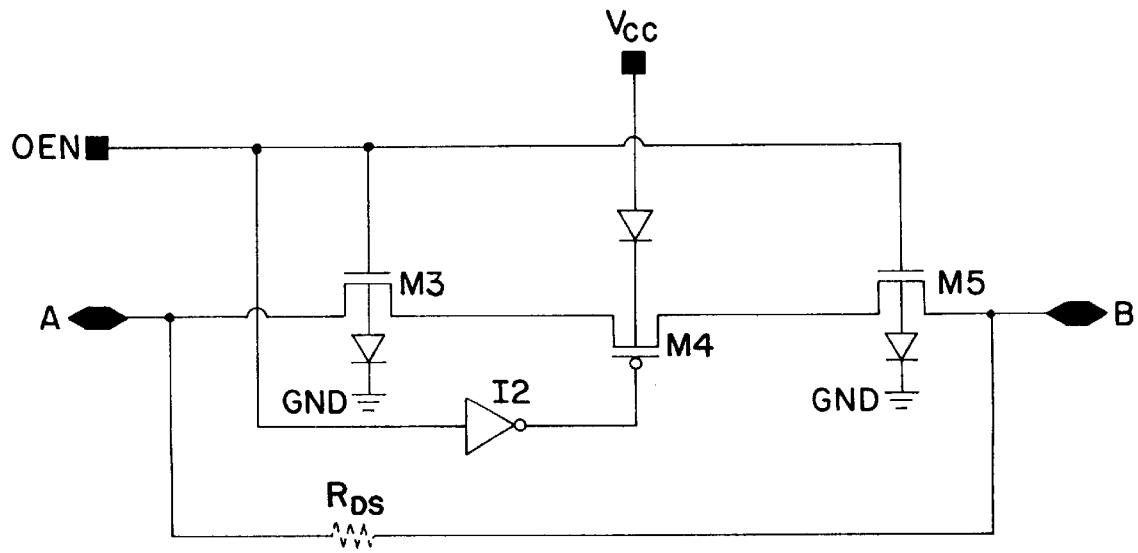
FIG. 3 is a simplified diagram of a prior-art transfer gate having a series of MOS transistors as the primary transfer components of the transfer device.

As illustrated in FIG. 4, an overvoltage-tolerant transfer gate 10 of the present invention includes as the primary transfer elements a first transfer transistor M0, a second transfer transistor M1, and a third transfer transistor M2, wherein transistors M0 and M1 are P-type transistors that are preferably enhancement-mode PMOS transistors, and wherein transistor M2 is an N-type transistor that is preferably an enhancement-mode NMOS transistor. Node A, which may be either an input node or an output node, dependent upon the direction of the signal passing between the circuitry coupled to node A and the circuitry coupled to node B, is coupled to a drain of transistor M0 and a drain of transistor M2. Node B is coupled to a drain of transistor M1 and to a source of transistor M2. The source of transistor M0 and the source of transistor M1 are coupled together. The bulk of transistor M2 is preferably coupled to low-potential power rail GND, while the bulk of transistor M0 is preferably coupled to a variable-potential power rail Pvcca and the bulk of transistor M1 is preferably coupled to a variable-potential power rail Pvccb. Inverter I14 is powered by variable-potential power rail Pvcca, while inverter I15 is powered by variable-potential power rail Pvccb. P-arbiter blocks 100 and 101 provide the logic circuitry suitable for ensuring that the higher potential of that associated with supply high-potential power rail Vcc and either of node A or B is delivered to inverter I14 or I15, respectively. An exemplar circuit suitable for creation of blocks 100 and 101, will be described herein with reference to FIG. 5.

The control of the three key transistors of the overvoltage tolerant gate 10 is determined by the potential supplied to the gates of each of those transistors as provided by control node OEN that is in turn supplied by an independent voltage source. The OEN control is shown to be coupled to the gates of PMOS transistors M0 and M1 through potential-regulating inverters I13, I14, and I15. The gate of NMOS transistor M2 is shown to be coupled to OEN through inverter I16 in order to provide the appropriate control potential in relation to the potential at the gates of M0 and M1. Of course, multiple inverters or other logic functions may be used if determined to be necessary. In general, it is to be noted that NMOS transistor M2 is designed with a much greater channel width than that of transistors M0 and M1 in order to provide the majority of charge required to charge/discharge nodes A and B. Transistors M0 and M1 supply only enough charging/discharging to ensure full high-potential-rail deflection under DC conditions.

For illustration purposes only, the discussion of the circuit 10 presented in FIG. 4 shows node A as the input node and node B as the output node. However, it is to be understood that their roles can be reversed without deviating from the basic operation of the circuit.

As illustrated in FIG. 4, the overvoltage transfer gate circuit 10 includes the control node OEN that is coupled to the input of first inverter I13. The output of second inverter I14 is coupled to the gate of transistor M0. A third inverter I15 has an input coupled to the output of first inverter I13 and an output coupled to the gate of transistor M1. Fourth inverter I16 has the control node OEN as an input, and has an output coupled to the gate of transistor M2. The four inverters I13–I16 are designed to provide buffering in the circuit 10 so as to reduce the capacitances of the gates of pass transfer transistors M0–M2, which capacitances would otherwise be transmitted to OEN.

Each of the P-Arbiter blocks 100 and 101 includes two PMOS transistors M4 and M5, configured in such a way as to pass the higher potential of either Vcc or node A (or node B) to the Pvcc output, as shown in the exemplar block illustrated in FIG. 5. That is, the block design shown in FIG. 5 may be used to develop either Pvcca or Pvccb. Specifically, one P-arbiter block (block 100) is linked to node A, while the other P-arbiter block (block 101) is linked to node B. For purposes of illustration of the operation of the gate 10, A side operation will be discussed with reference to block 100. Operation of the P-Arbiter circuit connected to the node B side is similar to that of node A. Under normal operation, node A is at a lower potential than Vcc, and transistor M5 serves to connect the node Pvcc to Vcc. Under overvoltage conditions, node A is at a higher potential than Vcc, and transistor M4 serves to connect node A to node Pvcc. In either case, the higher of the two potentials, Vcc or node A, appears at node Pvcc. In cases where the two potentials are equal, both transistors M4 and M5 are off, and node Pvcc floats to a potential no lower than $Vcc-Vf_{sb}$, where $Vf_{sb}$ is the voltage drop across the source-bulk p-n diode under pico-ampere leakage conditions, typically 0.5 to 0.6 Volts. Operation occurs in the same manner with regard to block 101.

As illustrated in FIG. 6, an undervoltage-tolerant transfer gate 11 of the present invention is a complementary configuration to the circuitry shown in FIG. 4. The undervoltage-tolerant transfer gate 11 includes as the primary transfer elements a first transfer transistor M6, a second transfer transistor M7, and a third transfer transistor M8, wherein transistors M6 and M7 are N-type transistors that are preferably enhancement-mode NMOS transistors, and wherein transistor M8 is a P-type transistor that is preferably an enhancement-mode PMOS transistor. Node A, which may be either an input node or an output node, dependent upon the direction of the signal passing between the circuitry coupled to node A and the circuitry coupled to node B, is coupled to a drain of transistor M6 and a drain of transistor M8. Node B is coupled to a drain of transistor M7 and to a source of transistor M8. The source of transistor M6 and the source of transistor M7 are coupled together. The bulk of transistor M8 is preferably coupled to high-potential power rail Vcc, while the bulk of transistor M6 is preferably coupled to a variable-potential power rail Pgnda and the bulk of transistor M7 is preferably coupled to a variable-potential power rail Pgndb. Inverter I16 is coupled to rail Pgnda, while inverter I17 is coupled to variable-potential power rail Pgndb. N-arbiter blocks 102 and 103 provide the logic circuitry suitable for ensuring that the lower potential of that associated with supply low-potential power rail GND and either of node A or B is delivered to inverter I16 or I17, respectively. An exemplar circuit suitable for creation of blocks 102 and 103, will be described herein with reference to FIG. 7, complementing the circuit shown in FIG. 5.

Each of the N-Arbiter blocks 102 and 103 includes two NMOS transistors M9 and M10, configured in such a way as to pass the lower potential of either GND or node A (or node B) to the Pgnd output, as shown in the exemplar block illustrated in FIG. 7. That is, the block design shown in FIG. 7 may be used to develop either Pgnda or Pgndb. Specifically, one N-arbiter block (block 102) is linked to node A, while the other N-arbiter block (block 103) is linked to node B. For purposes of illustration of the operation of the gate 11, A side operation will be discussed with reference to block 102. Operation of the N-Arbiter circuit connected to the node B side is similar to that of node A. Under normal operation, node A is at a higher potential than GND, and transistor M10 serves to connect the node Pgnd to GND. In undervoltage conditions, node A is at a lower potential than GND, and transistor M9 serves to connect node A to node Pgnd. In either case, the lower of the two potentials, GND or node A, appears at node Pgnd. In cases where the two potentials are equal, both transistors M9 and M10 are off, and node Pgnd floats to a potential no higher than GND+$Vf_{sb}$, where $Vf_{sb}$ is the voltage drop across the source-bulk p-n diode under pico-ampere leakage conditions, typically 0.5 to 0.6 Volts. Operation occurs in the same manner with regard to block 103.

Figure 8:
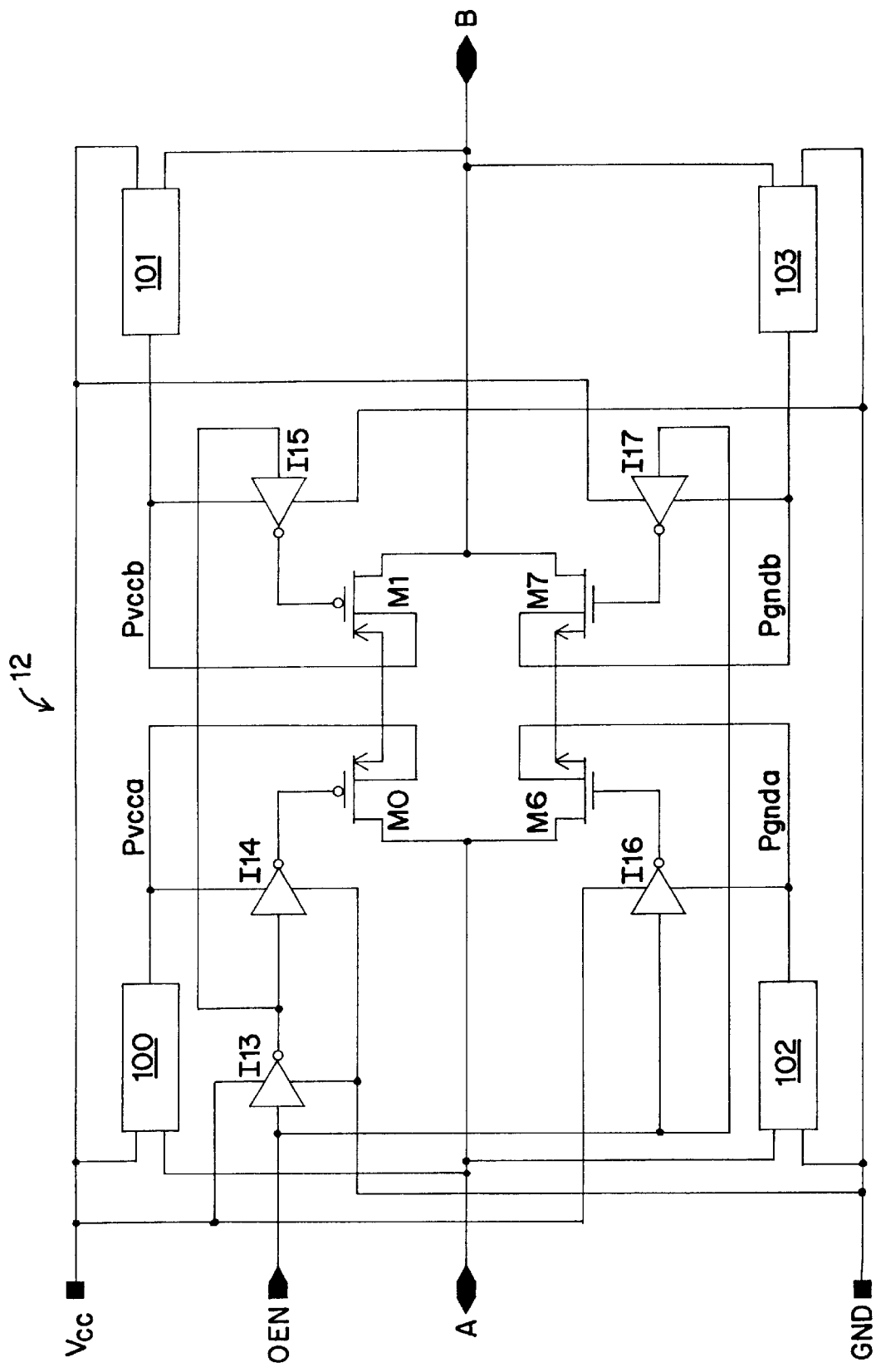
FIG. 8 is a schematic block diagram of an overvoltage and undervoltage tolerant transfer gate circuit of the present invention, showing a pair of PMOS transistors in combination with a pair of NMOS transistors as the primary transfer components of the transfer gate device in an extended circuit, making use of both the P-Arbiter blocks of FIG. 5 and the N-Arbiter blocks of FIG. 7.

Finally, an overvoltage/undervoltage tolerant transfer gate 12 is illustrated in FIG. 8. The gate 12 includes the components described with reference to FIGS. 4 and 6; however, only transistors M0–M1 and M6–M7 are required, and the inverters shown as inverters I13–17 result from integration of the inverters described with respect to gates 10 and 11. The complete circuit of FIG. 8 provides within an optional single system the overvoltage tolerance and undervoltage tolerance offered independently by gates 10 and 11.

While the preferred primary embodiment of the present invention has been described in detail structurally with respect to gates 10 and 12, the following is a summary of the operation of the circuit 10 under seven exemplar conditions. It is to be understood that the circuit 10 will permit signal passage A→B when on, and it will act as a very high impedance blocking any signal A→B when held off, regardless of any "overvoltage" at either A or B. As noted, the circuit is symmetric; therefore, while specific reference in the following description is being made to signal transfer from A to B, the circuit 10 will perform in the same way for signal transfer from B to A.

1. Input TTL low, circuit enabled. Voltage at node A=0.4V, Voltage at OEN=0.4V, Vcc=3.0V: Node A P-Arbiter transistor M4 is cut off, transistor M5 is saturated. Rail Pvcca is charged to Vcc by M5. M2's gate is charged to Vcc by inverter I16. The output of inverter I13 is charged to Vcc, causing the outputs of inverters I14 and I15 to discharge the gates of transistors M0 and M1 to GND. Node B is discharged to approximately 0.4V by M2 alone since the voltage at node A is sufficiently low to pinch off transistor M0($V_{TP}$+γ($V_{SB}$)$^{1/2}$ for PMOS transistors). With M0 in pinchoff, the series path of M0 and M1 no longer contributes to A→B conduction. Node B P-Arbiter rail Pvccb is charged to Vcc similar to node A P-Arbiter Pvcca. No current is sourced by node A or B.

2. Input TTL high, circuit enabled. Voltage at node A=2.4V, Voltage at OEN=0.4V, Vcc=3.0V: Node A P-Arbiter transistor M4 is cut off, transistor M5 is conducting in the sub-threshold region. Rail Pvcca is charged to VCC–$Vf_{sb}$ by M5 of the P-Arbiter with transistor M5 P+/N– source-bulk isolation junction, then slowly charged to Vcc by the sub-threshold conduction of M5. Transfer transistor M2's gate is charged to Vcc through inverter I16. Transistor M2 is thereby saturated and charges node B to VCC–$V_{TN}$–γ($V_{SB}$)$^{1/2}$, where γ($V_{SB}$)$^{1/2}$ is the "body effect" voltage degradation previously described. That value is approximately 2.2V. At that point, transistor M2 begins to cut off. Transistors M0 and M1 are saturated since their gates are discharged to GND by inverters I14 and I15, bringing the potential at node B to approximately the potential at node A—about 2.4V. Rail Pvccb is charged by the P-Arbiter coupled to node B.

3. Input at Vcc, circuit enabled. Voltage at node A=3.0V, Voltage at OEN=0.4V, Vcc=3.0V: P-Arbiter transistors M4 and M5 are cutoff. Rail Pvcca is charged to Vcc–$Vf_{sb}$ by M5 of the P-Arbiter coupled to node A; with transistor M5 P+/N– source-bulk isolation junction. Transistor M2 charges node B to VCC–$V_{TN}$–γ($V_{SB}$)$^{1/2}$. Transistors M0 and M1 are saturated, bringing the potential at node B to approximately the potential at node A—about 3.0V—assuming a purely capacitive load at node B. Rail Pvccb is charged to Vcc–$Vf_{sb}$ by the P-Arbiter coupled to node B.

4. Mild overvoltage condition, circuit enabled. Voltage at node A=3.6V, Voltage at OEN=0.4V, Vcc=3.0V: Node A P-Arbiter transistor M5 is cut off, transistor M4 conducts in the sub threshold region. Rail Pvcca is charged to 3.6V–$Vf_{sb}$ by transistor M4's source-bulk isolation junction, then charged to 3.6V by the sub-threshold current of M4. Transfer transistor M2's gate is charged to Vcc by inverter I16. Transistor M2 is thereby saturated and charges node B to VCC–$V_{TN}$–γ($V_{SB}$)$^{1/2}$. At that point, transistor M2 begins to cut off. Transistors M0 and M1 continue to conduct, since their gates are coupled to GND through inverters I14 and I15, bringing the potential at node B to approximately the potential at node A—about 3.6V—again assuming a purely capacitive load at node B. Rail Pvccb is charged to approximately the same potential as node B by the P-Arbiter coupled to node B.

5. Extreme overvoltage condition, circuit enabled. Voltage at node A=5.0V, Voltage at OEN=0.4V, Vcc=3.0V: Under this condition, A-side P-Arbiter transistor M5 is cut off. A-side P-Arbiter transistor M4 saturates, charging rail Pvcca to the voltage at node A=5.0V. Transfer transistor M2's gate is initially charged to Vcc by inverter I16. Transistor M2 is thereby saturated and charges node B to VCC–$V_{TN}$–γ($V_{SB}$)$^{1/2}$. At that point, transistor M2 begins to cut off. Transistors M0 and M1 continue to conduct, since their gates are coupled to GND through inverters I14 and I15, bringing the potential at node B to approximately the potential at node A—about 5.0V—again assuming a purely capacitive load at node B. Rail Pvccb is charged to the value of node B (approximately 5.0V) through B-side P-Arbiter transistor M4.

6. Mild Input overvoltage condition while circuit disabled. Voltage at node A=3.6V, Voltage at OEN=2.4V, Vcc=3.0V: Node A P-Arbiter transistor M5 is cut off, transistor M4 conducts in the sub threshold region. Rail Pvcca is charged to $3.6V-Vf_{sb}$ by transistor M4's source-bulk isolation junction, then charged to 3.6V by the subthreshold current of M4. Transfer transistor M2's gate is discharged to GND by inverter I16, cutting off M2. The gate of transistor M0 is charged to the potential at rail Pvcca via inverter I14. Since the bulk of transistor M0 is coupled directly to rail Pvcca, transistor M0 is cut off. As a result, node B is isolated from node A.

7. Extreme Input overvoltage condition while circuit disabled. Voltage at node A=5.0V, Voltage at OEN=2.4V, Vcc=3.0V: Node A P-Arbiter transistor M5 is cut off, transistor M4 conducts in the saturated region. Rail Pvcca is charged to 5.0V by transistor M4. Transfer transistor M2's gate is discharged to GND by inverter I16, cutting off M2. The gate of transistor M0 is charged to the potential at rail Pvcca via inverter I14. Since the bulk of transistor M0 is coupled directly to rail Pvcca, transistor M0 is cut off as in Condition 6 above. Node B is therefore isolated from node A.

As discussed above, the undervoltage tolerant transfer gate of the present invention, shown in FIG. 6 utilizing the N-Arbiter circuit of FIG. 7, performs in a complementary manner to the complement of the conditions listed above. The overvoltage and undervoltage tolerant transfer gate of the present invention operates as described in the conditions 4–7 above during overvoltage events, and operates as the complementary description during undervoltage events.

While the present invention has been described with specific reference to particular embodiments, it is to be understood that all modifications, variants, and equivalents are deemed to be within the scope of the following appended claims.

What is claimed is:

1. A transfer gate for passing a logic signal from an input node to an output node, said transfer gate comprising:
   a. a first transfer transistor having a first node coupled to the input node, a second node coupled to the output node, and a control node coupled to a control signal node;
   b. a second transfer transistor having a first node and a second node, wherein said first node is coupled to the input node and a control node coupled to said control signal node, wherein a bulk section of said second transfer transistor is coupled to a first pseudo-high-potential power rail; and
   c. a third transfer transistor having a first node coupled to the output node, a control node coupled to said control signal node, and a second node coupled to said second node of said second transfer transistor node, wherein a bulk section of said third transfer transistor is coupled to a second pseudo-high-potential power rail.

2. The transfer gate as claimed in claim 1 wherein said first transfer transistor is an NMOS transistor and said second transfer transistor and said third transfer transistor are PMOS transistors.

3. The transfer gate as claimed in claim 2 further comprising an inverter coupled between said control signal node and said control node of said NMOS transistor.

4. The transfer gate as claimed in claim 2 wherein said NMOS transistor is sized relatively larger than said PMOS transistors.

5. The transfer gate as claimed in claim 1 wherein said first pseudo-high-potential rail is coupled to an output of a first arbiter circuit and said second pseudo-high-potential rail is coupled to an output of a second arbiter circuit, wherein said first arbiter circuit has a first input coupled to a high-potential power rail and a second input coupled to the input node, and wherein said second arbiter circuit has a first input coupled to said high-potential power rail and a second input coupled to the output node.

6. The transfer gate as claimed in claim 5 wherein said first arbiter circuit and said second arbiter circuit each includes a first arbiter transistor and a second arbiter transistor, wherein said first arbiter transistor of said first arbiter circuit has a control node coupled to said high-potential power rail, a second node coupled to the input node, and a third node coupled to said output of said first arbiter circuit, and wherein said second arbiter transistor of said first arbiter circuit includes a control node coupled to the input node, a second node coupled to said high-potential power rail, and a third node coupled to said output of said first arbiter circuit, and wherein said first arbiter transistor of said second arbiter circuit has a control node coupled to said high-potential power rail, a second node coupled to the output node, and a third node coupled to said output of said second arbiter circuit, and wherein said second arbiter transistor of said second arbiter circuit includes a control node coupled to the output node, a second node coupled to said high-potential power rail, and a third node coupled to said output of said second arbiter circuit.

7. A transfer gate for passing a logic signal from an input node to an output node, said transfer gate comprising:
   a. a first transfer transistor having a first node coupled to the input node, a second node coupled to the output node, and a control node coupled to a control signal node;
   b. a second transfer transistor having a first node and a second node, wherein said first node is coupled to the input node and a control node coupled to said control signal node, wherein a bulk section of said second transfer transistor is coupled to a first pseudo-low-potential power rail; and
   c. a third transfer transistor having a first node coupled to the output node, a control node coupled to said control signal node, and a second node coupled to said second node of said second transfer transistor node, wherein a bulk section of said third transfer transistor is coupled to a second pseudo-low-potential power rail.

8. The transfer gate as claimed in claim 7 wherein said first transfer transistor is a PMOS transistor and said second transfer transistor and said third transfer transistor are NMOS transistors.

9. The transfer gate as claimed in claim 7 wherein said first pseudo-low-potential rail is coupled to an output of a first arbiter circuit and said second pseudo-low-potential rail is coupled to an output of a second arbiter circuit, wherein said first arbiter circuit has a first input coupled to a low-potential power rail and a second input coupled to the input node, and wherein said second arbiter circuit has a first input coupled to said low-potential power rail and a second input coupled to the output node.

10. The transfer gate as claimed in claim 9 wherein said first arbiter circuit and said second arbiter circuit each includes a first arbiter transistor and a second arbiter transistor, wherein said first arbiter transistor of said first arbiter circuit has a control node coupled to said low-potential power rail, a second node coupled to the input node, and a third node coupled to said output of said first arbiter circuit, and wherein said second arbiter transistor of said first arbiter circuit includes a control node coupled to the input node, a second node coupled to said low-potential power rail, and a third node coupled to said output of said first arbiter circuit, and wherein said first arbiter transistor of said second arbiter circuit has a control node coupled to said low-potential power rail, a second node coupled to the output node, and a third node coupled to said output of said second arbiter circuit, and wherein said second arbiter transistor of said second arbiter circuit includes a control node coupled to the output node, a second node coupled to said low-potential power rail, and a third node coupled to said output of said second arbiter circuit.

11. A transfer gate for passing a logic signal from an input node to an output node, wherein a high-potential power rail and a low-potential power rail supply power are coupled to said transfer gate, said transfer gate comprising:

a. a first transfer transistor having a first node coupled to the input node, a second node, and a control node coupled to a control signal node;

b. a second transfer transistor having a first node coupled to the output node, a second node coupled to said second node of said first transfer transistor, and a control node coupled to the control signal node;

c. a third transfer transistor having a first node coupled to the input node, a second node, and a control node coupled to the control signal node;

d. a fourth transfer transistor having a first node coupled to the output node, a second node coupled to said second node of said third transfer transistor, and a control node coupled to the control signal node;

e. a first arbiter circuit having a first input coupled to the input node, a second input coupled to said high-potential power rail, and an output coupled to a bulk region of said first transfer transistor;

f. a second arbiter circuit having a first input coupled to the output node, a second input coupled to said high-potential power rail, and an output coupled to a bulk region of said second transfer transistor;

g. a third arbiter circuit having a first input coupled to the input node, a second input coupled to said low-potential power rail, and an output coupled to a bulk region of said third transfer transistor; and h. a fourth arbiter circuit having a first input coupled to the output node, a second input coupled to said low-potential power rail, and an output coupled to a bulk region coupled to said fourth transfer transistor.

12. The transfer gate as claimed in claim 11 wherein said first and second transfer transistors are PMOS transistors and said third and fourth transfer transistors are NMOS transistors.

13. The transfer gate as claimed in claim 12 wherein said first arbiter circuit includes a first transistor having a control node coupled to said high-potential power rail and a second transistor having a control node coupled to the input node, said second arbiter circuit includes a first transistor having a control node coupled to said high-potential power rail and a second transistor having a control node coupled to the output node, said third arbiter circuit includes a first transistor having a control node coupled to said low-potential power rail and a second transistor having a control node coupled to the input node, and wherein said fourth arbiter circuit includes a first transistor having a control node coupled to said low-potential power rail and a second transistor having a control node coupled to the output node.

14. A process for passing a logic signal from an input node to an output node while blocking signals of excess potential, the process comprising the steps of:

a. coupling a first transfer transistor and a second transfer transistor to the input node where in the first transfer transistor is also coupled to the output node;

b. coupling a bulk section of said second transfer transistor to a first pseudo-high-potential power rail; and c. coupling a third transfer transistor to the second transfer transistor and the output node, wherein a bulk section of said third transfer transistor is coupled to a second pseudo-high-potential power rail.

15. The process as claimed in claim 14 further comprising the steps of coupling said first pseudo-high-potential rail to a first arbiter circuit and said second pseudo-high-potential rail to a second arbiter circuit, wherein said first arbiter circuit has a first input coupled to a high-potential power rail and a second input coupled to the input node, and wherein said second arbiter circuit has a first input coupled to said high-potential power rail and a second input coupled to the output node.

* * * * *